United States Patent
Southwell

(10) Patent No.: US 8,268,385 B2
(45) Date of Patent: Sep. 18, 2012

(54) OPTICAL MONITOR WITH COMPUTED COMPENSATION

(76) Inventor: William H. Southwell, Thousand Oaks, CA (US)

( * ) Notice: Subject to any disclaimer, the term of this patent is extended or adjusted under 35 U.S.C. 154(b) by 1133 days.

(21) Appl. No.: 12/152,334

(22) Filed: May 14, 2008

(65) Prior Publication Data
US 2011/0052793 A1  Mar. 3, 2011

Related U.S. Application Data

(60) Provisional application No. 60/931,787, filed on May 25, 2007.

(51) Int. Cl.
*C23C 14/54* (2006.01)
(52) U.S. Cl. ........... 427/10; 427/9; 702/33; 702/34; 702/35; 702/182
(58) Field of Classification Search .......... 427/10; 702/33–35, 182
See application file for complete search history.

(56) References Cited

U.S. PATENT DOCUMENTS

| | | | | |
|---|---|---|---|---|
| 5,425,964 A | * | 6/1995 | Southwell et al. | 427/10 |
| 7,760,358 B1 | * | 7/2010 | Aoyagi et al. | 356/369 |

* cited by examiner

*Primary Examiner* — Bret Chen
*Assistant Examiner* — Elizabeth Burkhart

(57) ABSTRACT

A method is provided for the determination a thickness error in a previously deposited layer using the reflection monitor signal of the currently-depositing layer. This thickness error is then used to compute corrections to the thickness of the currently-depositing layer and the next layer which corrects for the thickness error in the previous layer. The method is stable with respect to noise in the optical monitor signal. The technique is applicable for optical coating designs which are not necessarily quarter wave. The approach avoids the buildup of thickness errors from layer to layer and thus is applicable for very thick designs with many layers. Near the end of a currently depositing layer the monitor signal is used to fit the admittance of the base stack under the current layer. This establishes the parameters in an exact reflectance model used for the thickness monitoring of the current layer.

4 Claims, 3 Drawing Sheets

Method for computed compensation.

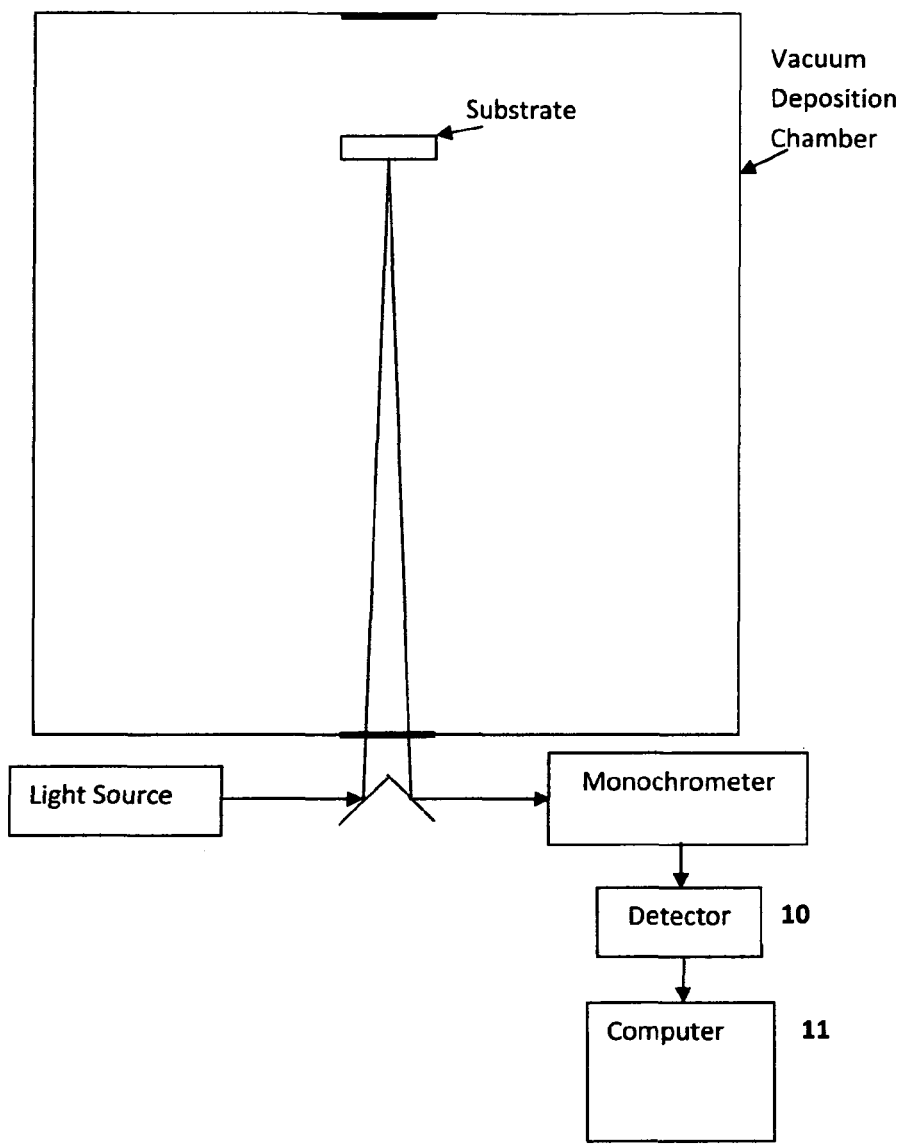
Figure 1. Layer thickness monitor for a vacuum deposition chamber.

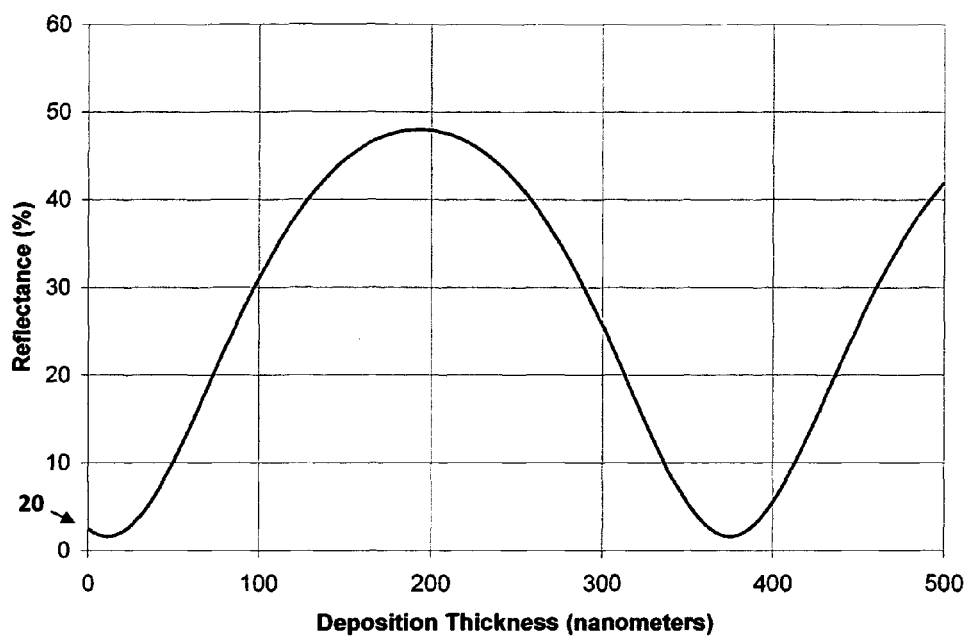
Figure 2. Monitor signal for 500 nm thick layer.

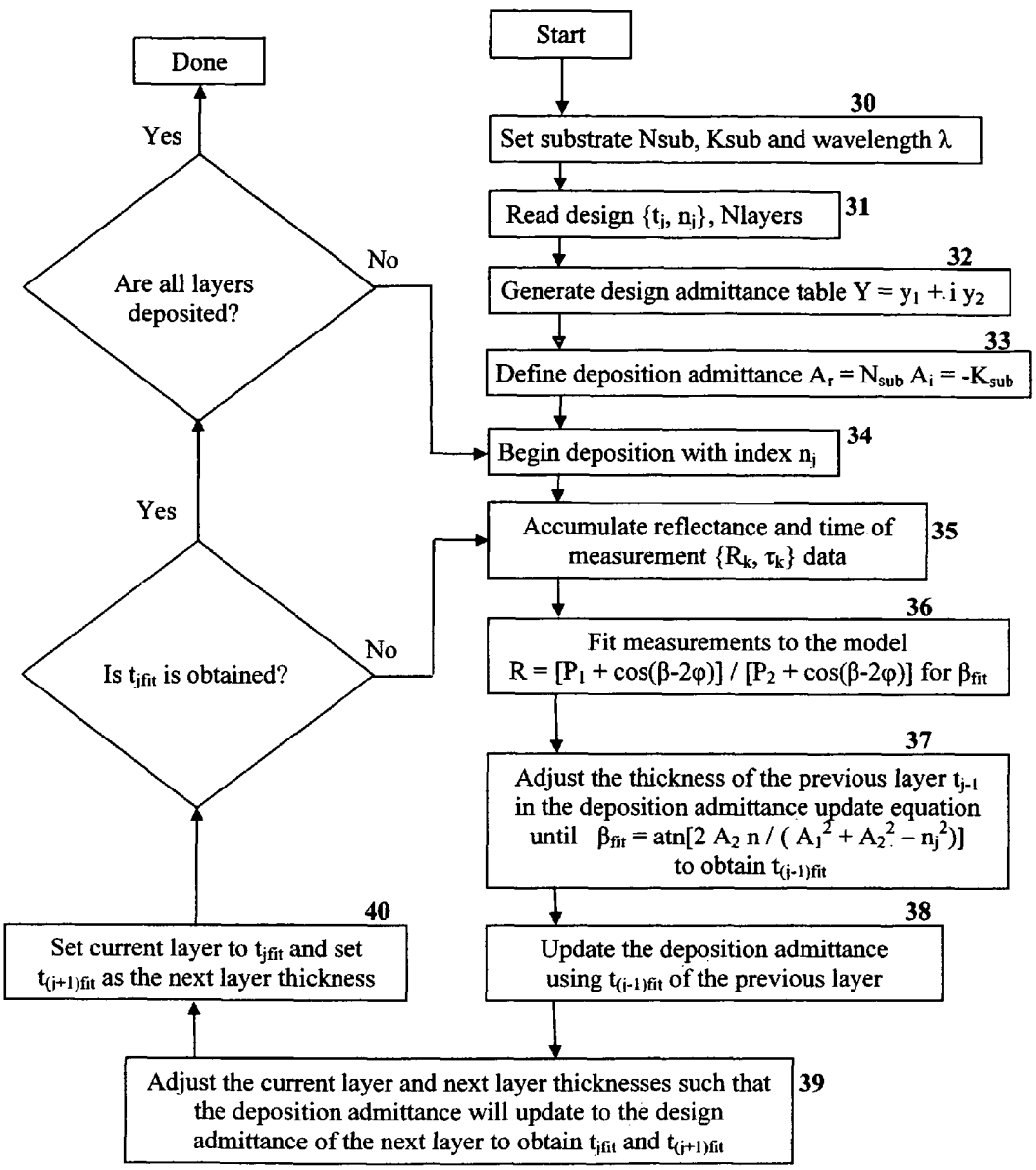
Figure 3. Method for computed compensation.

OPTICAL MONITOR WITH COMPUTED COMPENSATION

CROSS-REFERENCE TO RELATED APPLICATIONS

This application claims the benefit of provisional patent application No. 60/931,787 to William H. Southwell, filed May 25, 2007.

STATEMENT REGARDING FEDERALLY SPONSORED RESEARCH OR DEVELOPMENT

This invention was made with Government support under contract DASG60-W9113M-06-C-0146 awarded by U.S. Army Space and Missile Defense Command. The Government has certain rights in the invention.

REFERENCE TO SEQUENCE LISTING, A TABLE, OR A COMPUTER PROGRAM LISTING COMPACT DISC APPENDIX

"Not Applicable"

FIELD OF THE INVENTION

This invention relates to the deposition of thin films used, for example, in optical filters and to thickness monitoring and thickness error correction of such layers.

BACKGROUND OF THE INVENTION

To fabricate high performance optical filters it is necessary to accurately deposit all the layers of the multilayer design with sufficient accuracy to obtain the desired performance. Many high performance optical filters require a large number of layers, sometimes 100 layers or more, with a wide range of thicknesses. Layer thickness monitoring is required to achieve the desired layer thicknesses as close as possible.

Many types of filters, such as short wave band pass filters, long wave band pass filters, and broad band antireflective filters have optimum designs that are not quarter wave in nature. Rather, the best performing designs contain many layers each having different thicknesses.

There is a greater need today for high performance filters in the military and medical communities. There is a need to have an improved method of fabricating such filters. New design techniques in the last two decades have enabled the design of filters having higher performance; such as anti reflection coatings over very wide spectral bands, sharper and cleaner edge filters, and arbitrary spectral response filters. These designs consist of many layers, some thin, and generally all different thicknesses. The advantage of these designs is that better performance is seen. But the disadvantage is that they are more sensitive to thickness errors. Thus they require a more accurate thickness monitor.

Optical monitoring is described in the books by H. A. Macleod, THIN-FILM OPTICAL FILTERS, third edition, Taylor & Francis, 2001; and Ronald R. Willey, PRACTICAL DESIGN AND PRODUCTION OF OPTICAL THIN FILMS, second edition, Marcel Dekker, Inc. 2002. Turning point monitoring is a well known and highly successful technique for depositing designs consisting of multilayer coatings whose thicknesses are all multiples of quarter wave optical thickness. When monitoring the reflectance at the wavelength where the layers are one quarter wave optical thickness of such designs, the monitor exhibits self compensation. This means that thickness errors in one layer will be corrected when the succeeding layers is terminated at its turning point. A turning point occurs when the reflection changes direction, either it goes through a maximum or a minimum. But when the design consists of layers which are not quarter wave in thickness, this self compensation does not operate. Cheng-Chung Lee, et al. in a paper entitled, "Multilayer coatings monitoring using admittance diagram," Opt. Exp. 16, 6119-6124 (2008), have proposed a monitor that converts the transmittance signal to admittance in real time which then allows compensation to be calculated for non quarter wave designs. However, the method requires very precise transmittance measurements during deposition. The conversion from transmittance to admittance is inherently unstable because the measured transmittance is a real quantity and lacks phase information while admittance is a complex quantity which has two values, amplitude and phase. According to this paper the stability requirements are of the order of 0.1% rms of the monitor signal over long periods of time for the deposition of several layers. Typically 1% would be considered very good for optical monitor signals. Other tight constraints are also necessary. Byung Jin Chun and Chang Kwon Hwangbo in a paper entitled, "Optical monitoring of nonquarterwave layers of dielectric multilayer filters using optical admittance," Opt. Exp. 14, 2473-2480 (2006), describe a method for determining the error in the previous layer thickness based on small differences in the turning point reflectance of the current layer from that predicted from the design. This error information is then used to calculate a corrected thickness for the current layer and next layer to compensate for the thickness error in the previous layer. Again, this method requires absolute reflection measurements as well as other stringent requirements which are generally not realized in practice. Brian T. Sullivan and J. A. Dobrowolski, in 2 papers entitled, "Deposition error compensation for optical multilayer coatings, I. Theoretical description," Appl. Opt. 31, 3821-3835 (1992) and "Deposition error compensation for optical multilayer coatings. II. Experimental results-Sputtering system," Appl. Opt. 32, 2351-2360 (1993), describe another approach that uses a wide band or a multi-wavelength optical monitor to fit all the previously deposited layer thicknesses. These new thickness values are then used to perform a re-design of the remaining layer thicknesses and the deposition proceeds using these new target thicknesses. This reverse engineering approach attempts to solve an inverse problem which is inherently unstable. While it may work in some cases, in general reverse engineering will find a non-unique solution which is not the real values for thicknesses. Without good estimates of the thickness error of the deposited layers one cannot find thicknesses for later compensating layers.

I have developed a method that uses a single wavelength optical monitor which determines the error in the previous layer and recomputes the thicknesses of the currently depositing layer and the next layer to compensate for that error. This new method is more robust than previous methods with respect to noise in the optical monitor signal. This method works for designs that are not necessarily quarter wave in thickness.

BRIEF SUMMARY OF THE INVENTION

Compensation in thin film coating deposition means that when a thickness error occurs the current layer thickness and perhaps the next layer can be adjusted to correct for this error. Due to the statistical nature of the condensation or deposition process, the surface of the currently layer being processes is somewhat rough making that surface position somewhat uncertain. But when the next layer is being deposited on that surface the interface becomes smoother and better defined. Thus it is better to establish the thickness of a layer after it becomes embedded. Changes in the thickness of this previous layer are seen in the optical monitor trace of the current layer. The current layer optical monitor trace, which is the reflectance of the part being deposited, will depend on the admittance of the base stack upon which it is growing. I have developed a method for determining this base stack admittance from the monitor signal of the currently depositing layer and thus deduce the thickness of the previous layer that produces this value of admittance.

Once the thickness of the previous layer is known the thicknesses of the current layer and the next layer are adjusted so that the admittance at the end of the next layer will have its design value. The compensation remains local. The error in one layer is corrected in the next two layers. The objective is to end the deposition with the last layer having the same admittance that it was designed with. It is a fact that when the admittance is correct the spectra, reflectance or transmittance, will be the same at least in the neighborhood of the monitor wavelength.

This approach applies to designs which are not quarter wave stacks in general. An exact model is used for a single wavelength reflectance monitor signal at wavelength $\lambda$, $$R = [P_1 + \cos(\beta - 2\phi)]/[P_2 + \cos(\beta - 2\phi)], \quad (1)$$

where $P_1$ and $P_2$ are constants for each layer, $\phi = 2\pi n t/\lambda$ is the growing layer phase thickness, and $\beta$ is the beginning phase of this periodic reflectance function. This equation is valid for all layers, only the parameters $P_1$, $P_2$, and $\beta$ change for each layer. These parameters are functions of the base admittance upon which the currently layer is being deposited and can all be fit from the monitor signal of the current layer. However, $P_1$ and $P^2$ are related to the amplitude of the monitor reflectance signal and generally do not need to be adjusted to obtain the important phase information contained in the argument of the cosine function in the model.

This approach has the property that each layer is monitored independently of previous layers. There is no build up of thickness errors. All layers with uniform refractive index exhibit a monitor signal given by Eq. (1) regardless of what has previously been deposited. Furthermore, the monitor signal gives information about previous thickness errors which is necessary to know in order to compensate for those errors.

The method of detecting the thickness error in the previous layer and the re-computation of the layer thickness of the current layer to correct for this error is given in the following steps:

1. Starting with the base admittance $A_0 = y_r + i y_i$ at the substrate, $y_r = n_{sub}$ and $y_i = -k_{sub}$, generate a table of design admittances for the beginning of each layer in the design and end with the admittance at the end of the last layer. This is done using the admittance update equation, $$A_j = [A_{j-1} \cos(\phi_{j-1}) + i n_{j-1} \sin(\phi_{j-1})]/[\cos(\phi_{j-1}) + i A_{j-1} \sin(\phi_{j-1})/n_{j-1}],$$

$$\phi_{j-1} = 2\pi n_{j-1} t_{j-1}/\lambda. \; j=2 \text{ to (Number of Layers+1)},$$

where nj and tj are the design refractive index and design physical thickness of the jth layer.

2. Initiate a base deposition admittance $A_0 = A_r + i A_j$ starting at the substrate with the values $A_r = n_{sub}$ and $A_i = -k_{sub}$ set the layer number $j=1$.

3. Using $n_j$ the index of the currently depositing layer, calculate $P_1$, $P_2$, and $\beta$ which are the parameters for the monitor signal Eq. (1). This is done using the following equations $$P_1 = [r_a^2 + \rho_b^2]/(2 r_a \rho_b),$$

$$P_2 = [1 + r_a^2 \rho_b^2]/(2 r_a \rho_b).$$

where $$r_a = (1 - n_j)/(1 + n_j),$$

$$r_b = (n_j - A_j)/(n_j + A_j),$$

where A is the base deposition admittance for layer j. The amplitude reflection $r_b$ on the base side of the current layer is complex in general, which is expressed in complex polar form, $$r_b = r_{b1} + i r_{b2} = \rho_b \exp(i\beta),$$

where $r_{b1}$ and $r_{b2}$ are the real and imaginary parts of $r_b$. Knowing these we may obtain the polar components, $$\rho_b = [r_{b1}^2 + r_{b2}^2]^{1/2}$$

$$\beta = \arc \tan(r_{b2} r_{b1}).$$

4. Begin the deposition of layer j having index $n_j$ retaining the monitor reflectance R and deposition time $\tau$ for that layer to form the set $\{\tau_k, R_k\}$.

5. After some fraction of the deposition has occurred (at least 60%, for example), fit the monitor signal set for $\beta$ (and the deposition rate D if desired). This may done by constructing a merit function F, $$F = \Sigma[R_k - R(\beta, \phi_k)]^2 \text{ sum over k monitor measurements of the current layer}$$

$$\phi_k = 2\pi n_j (D\tau_k/\lambda),$$

using least squares techniques.

6. Use $\beta$ from step 5 as a target to find the previous layer thickness $t_{j-1}$ through the following equations, $$\beta = atn[(2A_j n_{j-1})/(A_r^2 + A_i^2 - n_{j-1}^2)],$$

$$A = A_r + i A_i = [A_{Base} \cos(\phi_{j-1}) + i n_{j-1} \sin(\phi_{j-1})]/[\cos(\phi_{j-1}) + i A_{Base} \sin(\phi_{j-1})/n_{j-1}],$$

$$\phi_{j-1} = 2\pi n_{j-1} t_{j-1}/\lambda.$$

$A_{Base}$ is the admittance at the beginning of the previous layer which is known. This step yields the thickness of the previous layer. It may be done, for example, with a least squares method with one data point, $\beta$ and one variable $t_{j-1}$.

7. With the thickness of the previous layer found in step 6 the base deposition admittance for the current layer is updated. At this point one takes the design admittance $A_{j+2}$ for the end of the next, which is the j+1th, layer and use that as a target with which to fit the thickness of the current layer and the thickness of the next layer. With $t_j$ and $t_{j+1}$ as variables one can compute the admittance at the end of the next layer by updating the base deposition admittance of the current layer using the current layer thickness, then, update that admittance with the thickness of the next layer. Adjusting these two layer thicknesses will bring the next layer deposition admittance in agreement with the design value. This step is similar to the fitting in step 6, except now there are two variables. There are also two targets, the real and imaginary parts of the design admittance, so this problem is solvable with least squares methods. With this step we now have updated thickness targets for the current layer and the next layer. If this is the last layer, only the current layer thickness is fit and it is fit to the design admittance at the end of the last layer.

8. Continue the deposition of the current layer until the new target thickness is achieved.

9. If this is not the last layer then advance the layer number to j=j+1 and go back to step 3 for the next layer, else exit the procedure.

BRIEF DESCRIPTION OF THE SEVERAL VIEWS OF THE DRAWING

In the drawings:

FIG. 1 is a schematic view of a vacuum deposition chamber used to deposit optical thin films.

FIG. 2 is a plot of an example optical monitor signal for a layer.

FIG. 3 is a flow logic flow diagram for a basic method of the present invention.

DETAILED DESCRIPTION OF THE INVENTION

Consider the recursive formula for the calculation of amplitude reflectivity, $$r = [r_a + r_b \exp(-i2\phi)]/[1 + r_a r_b \exp(-i2\phi)], \quad (1)$$

where $r_a$ is the Fresnel reflection of the air side surface and $r_b$ is the Fresnel reflection of the base side of the current layer with what is underneath it. The quantity r is the amplitude reflection from the air side of the entire structure including all multiple reflections. The layer phase thickness $\phi$ is at a wavelength $\lambda$ and for the current layer with index n and thickness t, $$\phi = 2\pi n t/\lambda. \quad (2)$$

It is easy to calculate $r_a$, $$r_a = (1-n)/(1+n), \quad (3)$$

where n is the index of the current layer. When the layer is non-absorbing then $r_a$ is always real and always negative. The amplitude reflection on the base side of the current layer, $r_b$ is complex in general, which we choose to write in complex polar form, $$r_b = r_{b1} + i r_{b2} = \rho_b \exp(i\beta), \quad (4)$$

where $r_{b1}$ and $r_{b2}$ are the real and imaginary parts of $r_b$. Knowing these we may obtain the polar components, $$\rho_b = [r_{b1}^2 + r_{b2}^2]^{1/2} \quad (5)$$

$$\beta = \arctan(r_{b2}/r_{b1}). \quad (6)$$

The magnitude reflectivity $\rho_b$ is real and always positive. It is assumed $\beta$ ranges from minus $\pi$ to plus $\pi$, $-\pi < \beta \leq \pi$. Using this polar form of $r_b$ in Eq. (1) we have, $$r = [r_a + \rho_b \exp(i(\beta - 2\phi))]/[1 + r_a \rho_b \exp(i(\beta - 2\phi))]. \quad (7)$$

Multiplying this by its complex conjugate gives the real reflectance R, $$R = [r_a^2 + \rho_b^2 + 2 r_a \rho_b \cos(\beta - 2\phi)]/[1 + r_a^2 \rho_b^2 + 2 r_a \rho_b \cos(\beta - 2\phi)]. \quad (8)$$

For convenience we write this as, $$R = [P_1 + \cos(\beta - 2\phi)]/[P_2 + \cos(\beta - 2\phi)]. \quad (9)$$

The parameters $P_1$ and $P_2$ are given by, $$P_1 = [r_a^2 + \rho_b^2]/(2 r_a \rho_b), \quad (10)$$

$$P_2 = [1 + r_a^2 \rho_b^2]/(2 r_a \rho_b). \quad (11)$$

Equation (9), with (10) and (11), is the reflectance model for the optical monitor under consideration. R models the reflectance seen from light at any wavelength $\lambda$ from the growing film. I now show how this expression is used to monitor thickness and index at normal incidence.

To use Eq. (9) one needs to know $\rho_b$ and $\beta$ as we start deposition of a new layer. The deposition starts with the first layer on the substrate. In that case $\rho_b$ and $\beta$ are known, $$r_b = [n - n_s]/[n + n_s]. \quad (12)$$

When n and $n_s$ are real, then $\rho_b = r_b^2$ and $\beta = 0$ or $\pi$ depending on whether $n < n_s$ or not. After the first layer one could use the recursive Eq. (1) to numerically compute the $r_b$ for the next layer using the layer thickness and index. Another alternative is to use admittance beginning with the substrate. In general, the base amplitude reflectivity is given by, $$r_b = [n - y]/[n + y], \quad (13)$$

where y is the admittance at the surface, and is in general complex, $y = y_1 + i y_2$. Admittance of the substrate is just the refractive index of the substrate. To derive the update equations for admittance after the deposition of a single layer, we have the B, C matrix equation, $$\begin{pmatrix} B \\ C \end{pmatrix} = \begin{pmatrix} \cos\varphi & i\sin\varphi/n \\ in\sin\varphi & \cos\varphi \end{pmatrix} \begin{pmatrix} 1 \\ y \end{pmatrix} \quad (14)$$

The updated admittance is computed from $$y = C/B. \quad (15)$$

But there is another more elegant way. After the deposition of the first layer and the computation of the amplitude reflectivity using Eq. (7), one then uses the following well-known equation for this same r, $$r = [1 - y]/[1 + y]. \quad (16)$$

This equation is easily inverted to yield the admittance y as a function of r, $$y = [1 - r]/[1 + r]. \quad (17)$$

Notice the symmetry between Eqs. (16) and (17). Equations (17) and (7) give the admittance update equations, $$y_1 = n(1 - \rho_b^2)/[1 + \rho_b^2 + 2\rho_b \cos\alpha] \quad (18)$$

$$y_2 = -2n\rho_b \sin\alpha/[1 + \rho_b^2 + 2\rho_b \cos\alpha], \quad (19)$$

where $$\alpha = \beta - 2\phi. \quad (20)$$

At this point the first layer is deposited and the admittance is updated. With the new admittance one is able to compute the new $r_b$ through the relation, $$r_b = \rho_b \exp(i\beta) = [n - y]/[n + y], \quad (21)$$

where n now is the index of the next layer to be deposited. Equation (21) is a complex equation which may easily be solved to give us the new base reflectance, $$\rho_b = \{[(n - y_1)^2 + y_2^2]/[(n + y_1)^2 + y_2^2]\}^{1/2}, \quad (22)$$

$$\beta = \arctan(-2n y_2/(n^2 - y^2)). \quad (23)$$

When the layer being deposited has a non-zero extinction coefficient k, then n in these equations become complex with the real part of n being the refractive index and the imaginary part being −k, the negative extinction coefficient. (The equations in that case are straight forward to derive and apply.

Thus, this method applies to the deposition of metals and semiconductors as well as dielectrics.)

This enables the use of Eq. (8) to be the model for the deposition of the next layer. The same procedure is now used for any succeeding layer. When a layer is finished, update the base stack admittance using Eqs. (18) and (19), then form the new base reflectivity from Eqs. (22) and (23).

DETAILED DESCRIPTION OF THE INVENTION

The filter substrates are typically placed near the top of the chamber as shown in FIG. 1. An optical beam is directed onto one of the fitters being deposited and then directed to an optical filter or monochrometer which selects the monitor wavelength. The beam is then directed to the detector 10 where the light intensity is measured and sent to a computer. The computer also records the time at which the measurement was made.

To get a better picture of how this approach works, consider the single wavelength optical monitor signal shown in FIG. 2. Every layer exhibits a periodic reflectance pattern, the length of which is determined by the layer thickness. This signal does not in general begin at a reflection minima or maxima (which are called turning points). Instead it begins at some angle β, shown in FIG. 2, as the angle 20. The value of beta for the example shown in FIG. 2 is 11.5°. This angle beta may be determined directly from the monitor data by fitting the reflectance model without any knowledge of what has been previously deposited. It is this fit value for beta that determines the thickness error of the previous layer. That information is obtained after the current layer has commenced and a sufficient amount of the periodic function is known. Knowing the function dependence of the monitor signal makes it easier to determine beta, the beginning phase.

The steps for determining the value of beta, the thickness of the previous layer, and the compensating thickness of the current and next layer are outlined in a logic flow diagram shown in FIG. 3. These steps are performed on or by a computer. The first step after beginning the program is to establish the substrate 30 by specifying its refractive index and extinction coefficient. Next the coating design is specified 31 with the numbering beginning with the first layer j=1 being deposited next to the substrate. The design admittance table 32 is generated and the initial deposition admittance 33 is set.

The layer deposition begins 34 with the refractive index nj. The reflectance measurements from the optical monitor are stored in the computer along with the time of the measurement 35. After a certain amount of time, when 10 or so measurement points have been accumulated, then the fitting 36 begins. In this step the accumulated reflectance data as a function of thickness, which is the deposition rate times the time since the deposition began, is fit to the reflectance model, Eq. (1). The parameters of this fit may include the deposition rate, beta, $P_1$ and $P_2$. The model parameters $P_1$ and $P_2$ may optionally be determined through the observed peaks and valleys of the monitor reflectance signal through the relations, $$P_2=(R_{max}+R_{min}-2)/(R_{max}-R_{min}),$$

$$P_1=R_{max}(P_2-1)+1.$$

When the value of beta has been obtained from the monitor signal the next step is to find the value of the thickness of the previous layer 37 which would produce this value of beta. Because this thickness is obtained from a measurement after the layer has been completed, it is a better indicator of the true thickness than the value the monitor has attempted to deposit. Furthermore, the measurement is not made until well into the next layer. This allows the interface to be well established and the thickness value to be firm. Surface interface effects with the new layer are being accounted for. It therefore provides a measure of the error in the previous layer, if indeed the estimated thickness value differs from the design value. With this knowledge of the thickness error of the previous layer the thickness of the currently depositing layer is now modified 38 in order to compensate for the known thickness error of the previous layer. This is yet another fitting process that may be done with least squared techniques 39. When these new thickness values are obtained, they are used as the target thicknesses 40 instead of the design values in the deposition.

The lower half of the flow diagram in FIG. 3 is a circular loop which continues during the layer deposition. When the layer has achieved its new target thickness, this loop is exited and either the next layer is started or the system is exited when all layers have been deposited.

Discussion

This computations and data fitting are not lengthy. The computer is able to do it on the fly. This allows the computation of the new target thickness for the current layer before its deposition is complete. The computation time is probably less than a second on a personal computer so the deposition does not have to be interrupted. The new layer thickness, along with the next layer thickness, is calculated in such a way that the admittance at the end of the next layer will be back to the design value. And if a deposited stack has its design admittance, then it will also have its design spectral performance in the wavelength neighborhood of the monitoring wavelength. Using the design admittance as the target for the computation of the compensating thicknesses, the spectral performance is restored and we are truly compensating for the error.

Learning that this is possible is a remarkable discovery. Even though the layer thicknesses are monitored, there is always some uncertainty as to the actual thickness. But with the β-fitting approach one is able to measure that thickness of the layer just deposited. Furthermore, the measurement is not made until well into the next layer. This allows the interface to be well established and the thickness value to be firm. Surface interface effects with the new layer are being accounted for. By updating the admittance again using the new thickness we have a more reliable base admittance which is carried forward.

This method may be classified as a redesign method, since we measure a previous thickness error and then redesign succeeding layers. However, since the approach uses the monitor algorithm itself to detect only the most recent layer thickness error and then corrects for it immediately with the currently depositing layer without interrupting the deposition, and since we are compensating for the error, we call this method: computed compensation monitoring.

Another aspect of this invention is its robustness with respect to errors in the reflectance and rate measurements. This invention enables computed compensation without a requirement of having absolute reflectance or transmittance. Furthermore the discovered method does not require having a turning point in each layer, which opens up the applicability to a much wider class of coating designs.

A key and novel element of the discovered method is the use of the angle β in the reflectance model. I have discovered a way to determine β from the reflectance data which does not depend on absolute reflectance or absolute transmittance measurements, and indeed, may be determined when there are offsets in such measurements such as when windows to the vacuum chamber become fogged. It also works when there are random fluctuations in the monitor signal. This means the method is robust in the presence of noise and calibration uncertainties. A further novel aspect of this invention is that the thickness error in the previously deposited layer may be determined from the value β fit from the current layer monitor signal. Another novel aspect of this invention is the discovery that by knowing the thickness error of the previously deposited layer one may determine corrections to the current and next layer thicknesses which restores the spectral performance at or near the monitor wavelength. There is no need to adjust all the remaining layers. This is a localized compensation for a local error.

There are several embodiments of this invention which may become evident to those skilled in the art of optical monitoring. For example, the selection of the monitoring wavelength may be determined to enhance the swing of the monitor signal. Monitoring wavelengths may differ for different layers. Indeed, multiple wavelengths may be used with admittance tables computed for each wavelength, enabling improved performance over wider spectral regions. However, these and other such embodiments occurring to those skilled in the art are all considered within the scope of this invention.

The following claims are made for this invention:

1. A method of compensating for layer thickness errors during deposition of a multilayer coating on a substrate, comprising the steps of:
   (1) providing a coating design specifying a substrate material and a layer material and a layer design thickness for each layer of the multilayer coating;
   (2) calculating an expected ending optical admittance for each layer of the multilayer coating, said expected ending optical admittance for a currently deposited layer serving as an expected beginning optical admittance for a next deposited layer of the multilayer coating;
   (3) monitoring a reflectance parameter as a function of time for light of a predetermined wavelength during deposition of a first coating layer on the substrate and during deposition of each currently deposited layer on a previously deposited layer to form the multilayer coating;
   (4) depositing a predetermined fraction of the currently deposited layer of the multilayer coating on the previously deposited layer of the multilayer coating and recording the reflectance parameter as a function of time to provide a measured reflectance curve;
   (5) determining an actual thickness of the previously deposited layer by comparing an expected reflectance curve based on an adjusted previous layer thickness with the measured reflectance curve of step (4);
   (6) adjusting the design thicknesses for the currently deposited layer and a next deposited layer to compensate for any difference between the actual thickness and the layer design thickness for the previously deposited layer;
   (7) completing deposition of the currently deposited layer to the adjusted design thickness from step (6); and
   (8) repeating steps (4)-(7) for the next deposited layer until all of the layers of the multilayer coating are deposited.

2. The method of claim 1, wherein the optical reflectance parameter is given by $R=[P_1+\cos(\beta-2\phi)]/[P_2+\cos(\beta-2\phi)]$ wherein the parameters $P_1$, $P_2$ and $\beta$ are constants for each layer determined from the refractive index of the current and previous layer and the admittance at the beginning of the current layer, and wherein $\phi$ is given by $\phi=2\pi t/\lambda$, where $t$ is the current layer thickness and $\lambda$ is the predetermined light wavelength.

3. The method of claim 1, wherein determining the actual thickness of the previously deposited layer is accomplished by iteratively adjusting the thickness of the previously deposited layer and calculating the resulting reflectance parameter for the currently deposited layer until there is agreement with the measured reflectance parameter for the currently deposited layer using least squares.

4. The method of claim 1, wherein adjusting the design thickness of the currently depositing layer and the next layer to compensate for the thickness error of the previous layer is accomplished by computing the predicted admittance from such adjustments at the end of the next layer until such predicted admittance agrees with the design admittance for the end of the next layer using least squares.

* * * * *